United States Patent
Bou-Ghannam et al.

(10) Patent No.: US 7,996,840 B2
(45) Date of Patent: *Aug. 9, 2011

(54) METHOD, SYSTEM, AND APPARATUS FOR SCHEDULING PATTERN BASED WEB SERVICES

(75) Inventors: Akram Bou-Ghannam, Lake Worth, FL (US); Thomas Creamer, Boca Raton, FL (US); Victor Moore, Lake City, FL (US); Scott Winters, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 176 days.

This patent is subject to a terminal disclaimer.

(21) Appl. No.: 12/416,625

(22) Filed: Apr. 1, 2009

(65) Prior Publication Data

US 2009/0187656 A1    Jul. 23, 2009

Related U.S. Application Data

(63) Continuation of application No. 10/706,177, filed on Nov. 12, 2003, now Pat. No. 7,533,383.

(51) Int. Cl.
 G06F 9/46 (2006.01)
 G06F 15/16 (2006.01)
 G06F 15/173 (2006.01)

(52) U.S. Cl. ......... 718/102; 718/106; 709/201; 709/224

(58) Field of Classification Search .................. 718/102, 718/106

See application file for complete search history.

(56) References Cited

U.S. PATENT DOCUMENTS

| | | | |
|---|---|---|---|
| 6,012,081 A * | 1/2000 | Dorn et al. | 718/102 |
| 6,067,637 A | 5/2000 | Auer et al. | |
| 6,278,978 B1 | 8/2001 | Andre et al. | |
| 6,298,373 B1 * | 10/2001 | Burns et al. | 709/203 |
| 6,363,411 B1 | 3/2002 | Dugan et al. | |
| 6,505,242 B2 * | 1/2003 | Holland et al. | 709/219 |
| 6,507,867 B1 * | 1/2003 | Holland et al. | 709/219 |
| 6,732,188 B1 | 5/2004 | Flockhart et al. | |
| 7,130,877 B2 * | 10/2006 | McNeely et al. | 709/201 |
| 7,133,834 B1 | 11/2006 | Abelow | |
| 7,206,848 B1 | 4/2007 | Zara et al. | |

(Continued)

OTHER PUBLICATIONS

Bentallah et al, "Towards Patterns of Web Services Composition", University of New South Wales, UNSW-CSE-TR-0111, Nov. 2001, pp. 1-35.*

(Continued)

*Primary Examiner* — Jennifer N To
(74) *Attorney, Agent, or Firm* — Novak Druce + Quigg LLP (57) ABSTRACT

A method of scheduling a request for a plurality of Web services can include providing service activation rules. Each service activation rule can specify a trigger condition and a state condition for causing a watcher to invoke a particular Web service. The method also can include receiving an event indicating a change in a common memory, wherein each event specifies trigger information, comparing the trigger conditions of the service activation rules with the trigger information of the event, adding the service activation rules that match the event to a trigger list, and comparing the state conditions of service activation rules in the trigger list with a state of the common memory. The service activation rules of the trigger list that match the state of the common memory can be selected thereby causing the invocation of at least one watcher and corresponding Web service.

16 Claims, 7 Drawing Sheets

U.S. PATENT DOCUMENTS

| | | |
|---|---|---|
| 7,289,989 B2 | 10/2007 | Bou-Ghannam et al. |
| 7,543,041 B2 * | 6/2009 | Bou-Ghannam et al. ..... 709/219 |
| 7,549,153 B2 * | 6/2009 | Butterworth et al. ......... 719/317 |
| 7,624,089 B2 * | 11/2009 | Diener .................................. 1/1 |
| 2001/0020249 A1 | 9/2001 | Shim |
| 2002/0013777 A1 * | 1/2002 | Diener .............................. 707/1 |
| 2002/0016729 A1 | 2/2002 | Breitenbach et al. |
| 2002/0021665 A1 * | 2/2002 | Bhagavath et al. ............ 370/229 |
| 2002/0078190 A1 * | 6/2002 | Ullmann ....................... 709/223 |
| 2002/0099593 A1 * | 7/2002 | Kraft et al. ...................... 705/10 |
| 2002/0133325 A1 | 9/2002 | Hoare, II et al. |
| 2002/0178034 A1 | 11/2002 | Gardner et al. |
| 2002/0178045 A1 | 11/2002 | Kraft et al. |
| 2002/0184344 A1 | 12/2002 | Elvanoglu et al. |
| 2003/0033288 A1 | 2/2003 | Shanahan et al. |
| 2003/0105837 A1 * | 6/2003 | Kamen et al. ................. 709/220 |
| 2004/0068586 A1 | 4/2004 | Xie et al. |
| 2004/0176976 A1 | 9/2004 | Bou-Ghannam |
| 2004/0225654 A1 | 11/2004 | Banavar et al. |
| 2005/0038708 A1 | 2/2005 | Wu |

OTHER PUBLICATIONS

U.S. Appl. No. 09/710,462, Cieliebak, et al.

* cited by examiner

METHOD, SYSTEM, AND APPARATUS FOR SCHEDULING PATTERN BASED WEB SERVICES

CROSS-REFERENCE TO RELATED APPLICATION

This application is a continuation of, and accordingly claims the benefit of, U.S. patent application Ser. No. 10/706,177, now issued U.S. Pat. No. 7,533,383, which was filed on Nov. 12, 2003, and which is hereby incorporated by reference in its entirety.

BACKGROUND

1. Field of the Invention

The invention relates to the field of Web services and, more particularly, to invoking Web services using a pattern-based approach.

2. Description of the Related Art

Web services, also referred to as application services, are services that are made available from Web servers for Web users or other Web-connected applications. Providers of Web services generally are known as application service providers. Web services can range from such major services as storage management and customer relationship management to much more limited services such as the furnishing of a stock quote or the checking of bids for an auction item. Other examples of Web services can include, but are not limited to, services that provide a telephone number in response to a provided name and services that return one or more electronic mail addresses for a provided name.

Web services typically are request response based and follow the client/server model. That is, a request from a client is sent to a server for fulfillment. Typically, the request is provided to the server formatted according to Remote Procedure Call (RPC) protocol. In general, RPC enables one application, the client, to request a service from another application, the server. RPC allows the client, operating in one computer system, to issue the request to the server, operating in a different computer system within a network. The client application, need not have an understanding of the operational details of the network to make a request of the server application when using RPC.

The request can be sent using Simple Object Access Protocol. In other words, a SOAP message containing RPC information is sent to the server. The server can then process the received request and provide a response to the client. SOAP is a protocol that enables a program running in one kind of operating system to communicate with a program in the same or another kind of operating system, and also computer system, by using the Hypertext Transfer Protocol (HTTP) and Extensible Markup Language (XML) as mechanisms for information exchange. SOAP specifies how to encode an HTTP header and an XML file so that a program in one computer can call a program in another computer as well as pass information.

Presently, the Web service paradigm specifies a procedure in which a request pertains to a single Web service. More particularly, each request initiates a single Web service and, therefore, is directed to a particular service provider. As such, to perform more complex actions involving more than one Web service, the client must issue a series of requests where each request is sent to a different Web service. That is, each constituent task of an action must be submitted to an appropriate Web service as a request.

If the tasks constituting the action are hierarchical in nature, such that one Web service requires information from another Web service to function, the requests must be issued to each Web service in proper order. In such cases, the client must receive a response from a given Web service so that the retrieved information can be used to build the request to be submitted to the next Web service in the hierarchy of Web services constituting the action to be performed.

SUMMARY OF THE INVENTION

The present invention provides a method, system, and apparatus for processing complex requests for Web services. The present invention can receive complex requests, or requests that specify more than one Web service to be performed. The Web services can be invoked through a scheduler that receives events indicating that a memory space has been modified, for example by adding, deleting, and/or modifying one or more pattern objects specifying services to be performed. The scheduler can determine which Web services should be executed by comparing information specified in the received events and information specified by the pattern object with a set of service activation rules.

The scheduler utilizes trigger and state information to execute Web services more efficiently. Trigger information describes an event relating to the modification of the work area. A state condition describes a particular state that must exist in the work area for that condition to be true. Rather than evaluate a trigger condition and a state condition for each service activation rule, a subset of the entire set of service activation rules having particular trigger conditions is determined. The subset is then searched for service activation rules having matching state conditions. By first determining the subset of service activation rules, processing overhead is reduced as each service activation rule in the system need not be evaluated for both trigger and state conditions.

One aspect of the present invention can include a method of scheduling a request for one or more Web services. The method can include (a) providing a plurality of service activation rules, where each service activation rule specifies a trigger condition and a state condition for causing a watcher to invoke a particular Web service, (b) receiving at least one event indicating a change in a common memory, wherein each event specifies trigger information, (c) comparing the trigger conditions of the service activation rules with the trigger information of the events, and (d) adding service activation rules that match the events to a trigger list.

The method also can include (e) comparing the state conditions of service activation rules in the trigger list with a state of the common memory and (f) selecting the service activation rules of the trigger list that match the state of the common memory. Selection of the service activation rules causes the invocation of at least one watcher and corresponding Web service. Notably, the state of the common memory can be dictated by one or more pattern objects. Each of the events indicating a change in the common memory can be associated with at least one pattern object. Step (e) can include adding service activation rules of the trigger list that match the pattern object to an executable list, wherein each service activation rule in the executable list is executed in step (f).

In another embodiment of the present invention, the method can include at least one of the watchers modifying the common memory, the common memory sending at least one event indicating a state change, wherein each event specifies a trigger condition, and repeating steps (b)-(f). At least one of the watchers can modify the common memory according to instructions from an associated one of the Web services.

Further, the watchers can modify the common memory by modifying one or more of the pattern objects. Thus, watchers can modify pattern objects according to instructions from an associated Web service. Notably, each pattern object can specify at least two Web services to be performed.

At least two of the watchers each can invoke an associated Web service to operate concurrently with one another in step (f). Alternatively, at least two watchers each can invoke an associated Web service to operate sequentially in step (f). The watchers can continue to invoke Web services until a termination watcher is activated and removes the pattern object from the common memory.

In another embodiment of the present invention, step (f) can include matched service activation rules within an execution list. The method further can include identifying service activation rules in the execution list that correspond to competitive Web services and comparing the identified service activation rules with at least one service selection rule. Watchers specified by the identified service activation rules can be invoked according to the comparing step.

Another aspect of the present invention can include a method of resolving conflicts between competing Web services. The method can include reading an execution list of service activation rules corresponding to watchers, wherein each watcher is configured to invoke an associated Web service, identifying service activation rules in the execution list corresponding to competitive Web services, and comparing the identified service activation rules with at least one service selection rule. The watchers specified by the identified service activation rules can be invoked according to the comparing step.

Another aspect of the present invention can include a system for processing complex requests for Web services. The system can include a plurality of service activation rules, each service activation rule specifying a trigger condition and a state condition for causing a watcher to invoke a particular Web service, a server configured to receive a request for more than one Web service, at least one servlet configured to extract a pattern object from the request and to format a response to the request, and a common memory that temporarily stores the pattern object while the Web services specified by the pattern object execute. Notably, the common memory also can generate events when the content of the common memory is changed.

The system further can include a plurality of watchers, each watcher corresponding to a particular Web service, and a scheduler configured to receive events, compare trigger conditions specified by the service activation rules with trigger information of events, compare state conditions of the service activation rules in the trigger list with state information specified by the pattern object, and select at least one of the service activation rules causing the invocation of at least one of the watchers and corresponding Web services.

In another embodiment, the system can include a termination watcher configured to provide the pattern object back to one of the servlets to generate a response. The watchers can be configured to modify the pattern object according to instructions provided from an associated one of the Web services. The system also can include an execution evaluation processor configured to select service activation rules associated with competitive Web services according to service selection rules. The execution evaluation processor can invoke one or more of the watchers according to the selected service activation rules.

Another aspect of the present invention can include a system for processing complex requests for Web services including a plurality of service activation rules, each service activation rule specifying a trigger condition and a state condition for causing a watcher to invoke a particular Web service. The system also can include a common memory that temporarily stores a pattern object while Web services specified by the pattern object execute. The common memory can generate events when content of the common memory is changed. The system further can include a trigger evaluation processor configured to compare the trigger conditions of the service activation rules with trigger information from at least one event. The trigger evaluation processor can add service activation rules that match the events to a trigger list.

The system can include a state evaluation processor configured to compare the state conditions of service activation rules in the trigger list with state information specified by at least one pattern object stored the common memory. The state evaluation processor can select the service activation rules of the trigger list that match the pattern object. Selecting the service activation rules causes the invocation of at least one watcher and corresponding Web service. The state evaluation processor further can add the service activation rules of the trigger list that match at least one pattern object to an execution list prior to execution of each service activation rule.

The system also can include an execution evaluation processor configured to select service activation rules associated with competitive Web services according to the service action rules. The execution evaluation processor invokes at least one of the watchers according to the selected service activation rules.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
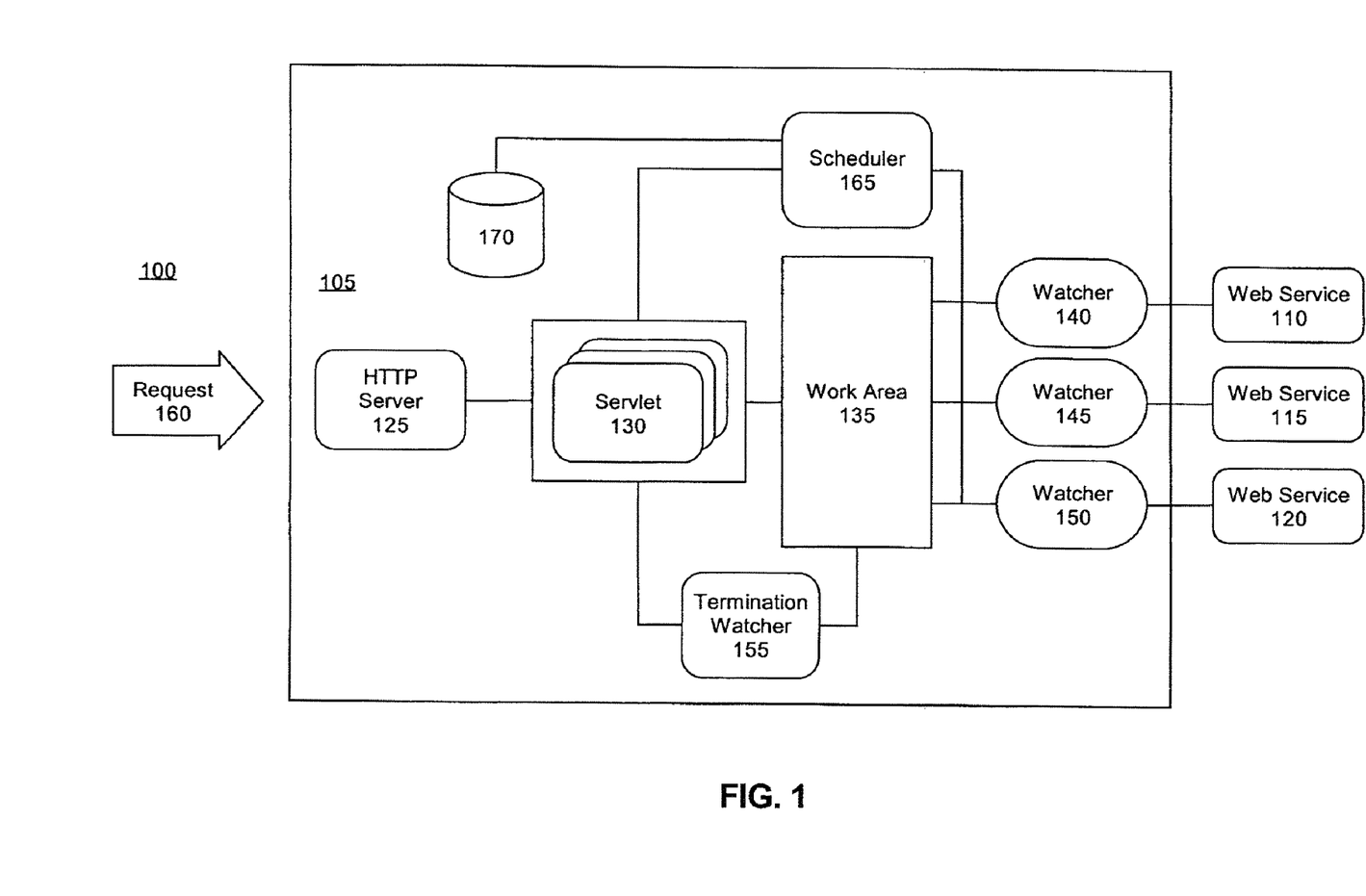
FIG. 1 is a schematic diagram illustrating one embodiment of a system for invoking pattern-based Web services in accordance with the inventive arrangements disclosed herein.

FIG. 1 is a schematic diagram illustrating a system 100 for invoking pattern-based Web services in accordance with one aspect of the inventive arrangements disclosed herein. As shown, the system 100 can include a core server 105 and several Web services 110, 115, and 120.

The core server 105 can be implemented as a computer system or other information processing system including but not limited to a general purpose computer system and/or a server computer system. The core server 105 can include a Hypertext Transfer Protocol (HTTP) Server application 125 (hereafter HTTP server), a collection of one or more servlets 130, a common memory space 135 and one or more watchers 140, 145, and 150. A termination watcher 155 can be included as well.

The HTTP server 125 can receive requests 160 and send responses to received requests. The HTTP server 125, for example, can receive requests formatted according to Simple Object Access Protocol (SOAP), and decode such requests. Further, responses also can be formatted as SOAP responses. The servlets 130 can be configured to extract a pattern object from received requests. The pattern object can specify a name, a string of characters, a sequence of numbers, rules, another object, or any other structure that can be held by an object. The servlets 130 can extract pattern objects from received requests and place the pattern objects in the work area 135. The servlets 130 further can provision the termination watcher 155 to monitor the pattern object. When processing upon the pattern object is completed by the various Web services 110-120, the servlets 130 receive the pattern object, whether modified or in the same condition as originally extracted from the request 160, and formulate a response to be sent to the requestor.

The work area 135 is a common memory space or portion of memory that can be used to store pattern objects extracted from received requests 160. The work area 135 includes programming to monitor for changes in the work area 135 memory space. That is, the work area 135 can detect when a new pattern object is added, when an existing pattern object is modified, and when a pattern object is deleted or removed. Anytime the work area 135 changes, the work area 135 generates an event that is sent to a scheduler 165. The work area 135 is accessible by each of the watchers 140, 145, and 150, the termination watcher 155, as well as the servlets 130. The watchers 140, 145, and 150 are software objects that invoke Web services. Each of the watchers is associated with a particular Web service as shown and can modify pattern objects located within the work area 135 as dictated by the Web service associated with each watcher.

The termination watcher 155 can monitor the work area 135 for a pattern object that conforms or matches one or more rules within the termination watcher 155. The termination watcher 155 is provisioned by one of the servlets 130 when the pattern object is extracted and placed in the work area 135. When a pattern object is detected by the termination watcher 155 that conforms with one or more of the rules, the termination watcher 155 removes the pattern object from the work area 135 and returns the pattern object to the servlet 130 that originally extracted the pattern object from the received request.

While the termination watcher 155 can monitor for a pattern object of a particular format that matches the rules stored therein, the termination watcher 155 also can terminate the operation of one or more Web services by removing the pattern object from the work area 135 after a detected fault, whether a time out condition or another fault. A time out condition, for example where the pattern object has been in the work area 135 for at least a predetermined amount of time, but does not conform to a rule within the termination watcher 155, can indicate that one or more of the Web services has not executed correctly or that some other fault condition has occurred.

Each of the Web services 140-150, can perform a particular task such as locating a Universal Resource Locator (URL) for determining telephone numbers, determining an electronic mail address when provided with a name, or determining a telephone number when provided a name or an electronic mail address. Those skilled in the art will appreciate that Web services can perform any of a variety of different processing tasks. As such, it should be appreciated that the examples of Web services disclosed herein are not intended to be a limitation on the range of functions or tasks that can be implemented by Web services. Further, while three watchers and corresponding Web services have been depicted, it should be appreciated that the core server 105 can include more watchers or fewer watchers depending upon the number of Web services that have been registered with the core server 105.

The scheduler 165 is a software object that can receive events detailing changes to the work area 135. The scheduler 165 further determines which watchers are to be invoked responsive to particular events and conditions. More particularly, the scheduler 165 can receive events from the work area 135 indicating that a change in the work area 135 has been detected, whether a pattern object has been added and/or removed. The events also can specify which pattern objects have been modified and the particular attributes that have changed. Generally, the scheduler 165 compares the events and the pattern objects associated with each event to service activation rules to determine which service activation rules should be placed in an execution list. Notably, each service activation rule can specify a particular watcher and corresponding Web service to be activated.

The data store 170 includes one or more of the service activation rules that can be accessed by the scheduler 165. Each service activation rule specifies a trigger condition and a state condition. A trigger condition specifies information that describes what must occur before a watcher, and therefore Web service, can be considered for activation. A state condition can specify information that describes the state that must be found to exist in the work area 135 before a watcher is activated. According to one embodiment of the present invention, the trigger condition and the state condition can be specified as logical expressions. In any case, both a trigger condition and a state condition of a service activation rule must be met before a watcher is activated.

In operation, the HTTP server 125 can receive a request 160. The HTTP server 125 can route the received request 160 to an available servlet 130 for further processing. For example, the request 160 can specify a particular servlet 130 as determined from a Web Services Description Language (WSDL) file corresponding to the requested Web services. The servlet 130 that receives the request can extract or parse the pattern object from the request 160. The servlet 130 then can store the pattern object within the work area 135.

The work area 135 then sends an event to the scheduler 165 indicating that a pattern object has been added. The event can provide trigger information concerning the pattern object that was added to the work area 135. The scheduler 165 can compare the received event with the service activation rules in the data store 170. Service activation rules having trigger conditions and state conditions that match the received event and corresponding pattern object can be identified. The scheduler 165 can cause the watchers specified by the matched service activation rules to execute.

When a watcher is executed or invoked, that watcher in turn invokes its associated Web service. The watchers 140-150 can invoke Web services 110-120 in sequential fashion, in parallel such that the Web services run concurrently with one another, or both concurrently and sequentially as will be described herein.

Web services 110-120 can continue to operate until the termination watcher 155 detects a termination criterion. For example, detecting a termination criterion can include, but is not limited to, determining that one or more rules contained within the termination watcher 155 match the pattern object or detecting a fault such as a time out. At that time, the termination watcher 155 returns the pattern object to the servlet 130 that extracted the pattern object from the request 160. The servlet 130 then formulates a response that is sent to the requester via the HTTP server 125.

It should be appreciated that according to another embodiment of the present invention, the termination watcher 155 can be configured to function as one of the watchers 140-150. For example, the termination rules of the termination watcher 155 can be specified as service activation rules within the data store 170. Accordingly, the termination watcher can be executed responsive to particular events being received by the scheduler 165 and the detection of a particular state of the work area 135 to be described herein.

Figure 2:
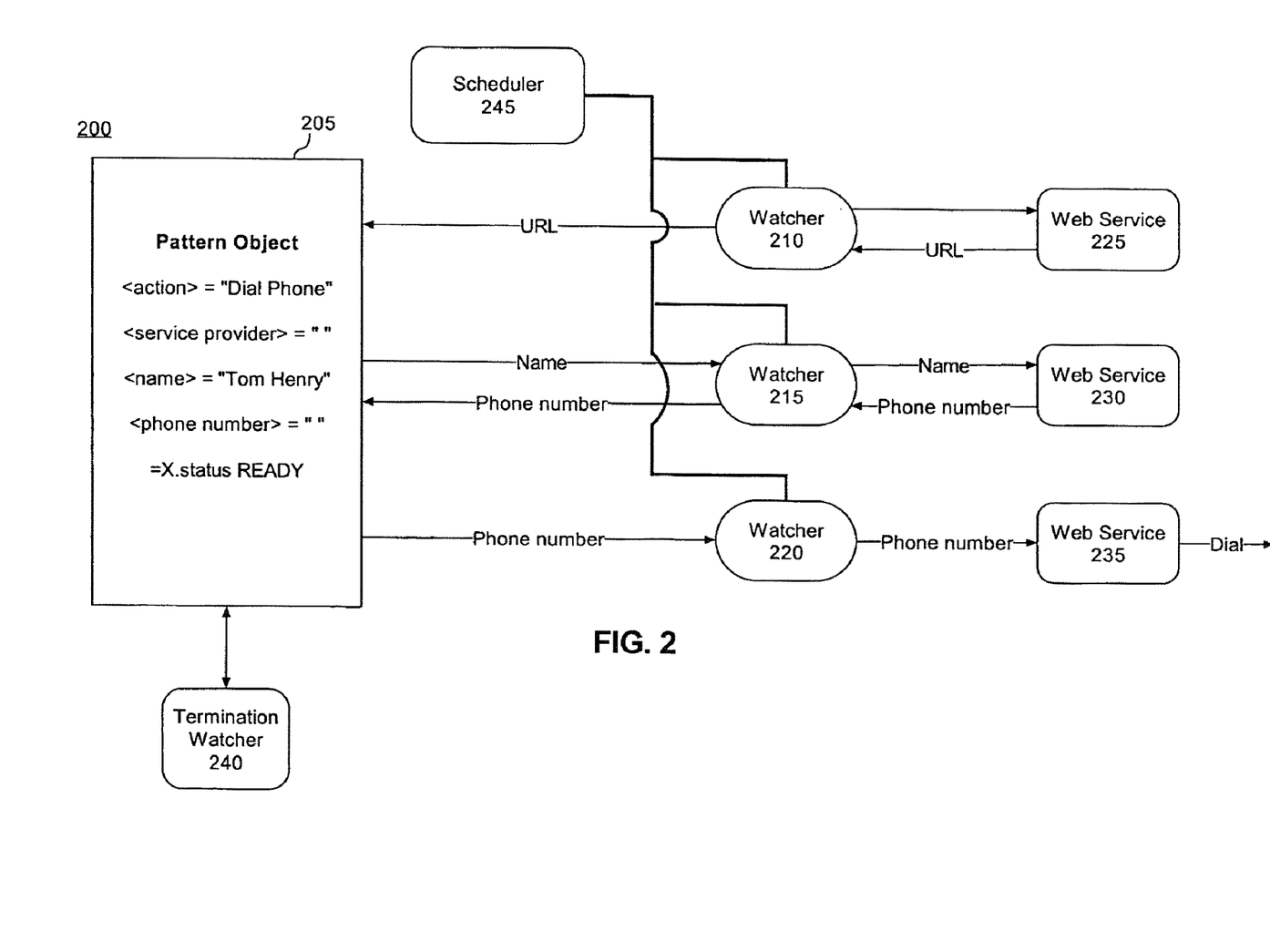
FIG. 2 is a schematic diagram illustrating another embodiment of a system for invoking pattern-based Web services in accordance with the inventive arrangements disclosed herein.

FIG. 2 is a schematic diagram illustrating another aspect of a system 200 for invoking pattern-based Web services in accordance with the inventive arrangements disclosed herein. As shown, system 200 illustrates the interaction of watchers 210, 215, and 220, a termination watcher 240, Web services 225, 230, and 235, a scheduler 245, and a pattern object 205.

The pattern object 205, as was described with reference to FIG. 1, is extracted from a received request by a servlet and stored in the work area. The work area further can send an event to the scheduler 245 indicating that a state change has occurred in the work area. Specifically, the event indicates that a pattern object 205 has been added to the work area. The pattern object 205 specifies one or more tasks that must be performed to execute a more complex action. In this case, by way of example, the pattern object 205 pertains to telephony services. The pattern object specifies a "dial phone" action and provides a name of "Tom Henry". A service provider and a telephone number, however, are not specified in the pattern object 205. Accordingly, to execute the action of dialing a phone, one or more additional tasks, each performed by a particular Web service, must be performed.

In this example, Web service 225 can return a URL of another Web service that can dial a telephone number. Web service 230 can return a telephone number if provided a name. Web service 235 can dial a telephone number. As each Web service 225-235 is registered with the core server, a watcher is assigned to each Web service. Upon registration, each Web service provisions rules within the watcher associated with that Web service. The watcher, in turn, registers with the core server and stores the provisioned rules as service activation rules within a data store (not shown). As noted, each service activation rule specifies a trigger condition and a state condition.

For instance, a service activation rule for watcher 210 and Web service 225 can specify a trigger condition stating that if a pattern object 205 having a pattern of "X" is received, for example where the pattern object 205 has a blank service provider attribute, the scheduler 245 will execute watcher 210 to invoke Web service 225. Thus, the scheduler 245 can invoke watcher 210 if the trigger information specified by the event received from the work area matches the trigger condition of the service activation rule corresponding to watcher 210.

In order to invoke a watcher, the scheduler 245 also must match the state information of the corresponding pattern object stored in the work area, or the state of the work area, with the state condition of the service activation rule. Accordingly, both the trigger condition and the state condition of a service activation rule must be matched to the trigger information of an event and the state information of a pattern object, or work area, respectively to launch a watcher. Thus, while not described with reference to FIG. 2, each time a watcher is invoked to execute a corresponding Web service, it is assumed that the state condition portion of the service activation rule was matched with the pattern object in the work area. For example, the attribute "=X.status READY" in pattern object 205 specifies state information that must be matched to the state condition of a service activation rule before the associated Web service can execute.

As shown, Web service 225 determines a URL for the service provider attribute of the pattern object 205 and provides the URL to watcher 210. Watcher 210 then can modify the pattern object 205 by writing the URL to pattern object 205 while in the work area so that the service provider attribute specifies the URL determined by Web service 225. Accordingly, the work area can send an event to the scheduler 245 indicating the new state of the work area. The event can specify trigger information indicating which attributes of the pattern object 205 have been modified.

When Web service 230 is registered with the core server, watcher 215 can be assigned. Web service 230 can provision a rule within watcher 215 which states that if the phone number attribute of the pattern object 205 is blank, and a name is available, then Web service 230 will be invoked. Watcher 215 can register and store this information with the core server as a service activation rule.

Accordingly, responsive to receiving an event having trigger information matching a service activation rule for watcher 215, the scheduler 245 can execute the watcher 215 to invoke Web service 230. Watcher 215 can provide Web service 230 with a name so that a phone number can be retrieved. Web service 215 provides the phone number to watcher 215, which writes the phone number to the pattern object 205 so that the phone number attribute specifies the phone number provided by Web service 230. The work area then send an event to the scheduler 245 indicating trigger information specifying which attributes have been modified in the pattern object 205.

Watcher 220 can be associated with Web service 235 when registered with the core server. At that time, Web service 235 can provision a rule within watcher 220, which can be stored as a service activation rule. The service activation rule can state that watcher 220 is not to be executed until all of the attributes of the pattern object 205 have been completed. When events indicating that all of the attributes of pattern object 205 have been completed, the scheduler 245 causes watcher 220 to invoke Web service 235. Accordingly, watcher 220 can provide the phone number to Web service 235, in addition to any other attributes that may be required, so that Web service 235 can dial the provided number.

From the example, it should be appreciated that a single event received by the scheduler 245 can cause watchers 210 and 215 to be executed. That is, watcher 210 and 215 can execute concurrently, as can Web services 225 and 230. Watcher 215 need not execute as a consequence of the event sent by the work area after Web service 225 has completed execution. After the phone number is dialed, watcher 220 can end or, alternatively, can modify the pattern object 205 by adding an identifier or some other reference prior to terminating execution.

In one embodiment of the present invention, after Web service 235 has finished execution, the work area can send an event having trigger information to the scheduler 245 that can be matched to a trigger condition of service activation rule specifying termination conditions. In that case, the scheduler 245 can execute the termination watcher 240. The termination watcher 240 can remove the pattern object 205 from the work area and return the pattern object 205 to the servlet.

In one embodiment of the present invention, the termination watcher 240 also can modify the pattern object 205 with an indication as to whether the Web services have executed properly or a fault has occurred. In another embodiment, the termination watcher 240 can simply return the pattern object 205 to the servlet and provide a separate notification as to whether the Web services were implemented correctly or a fault occurred.

Figure 3A:
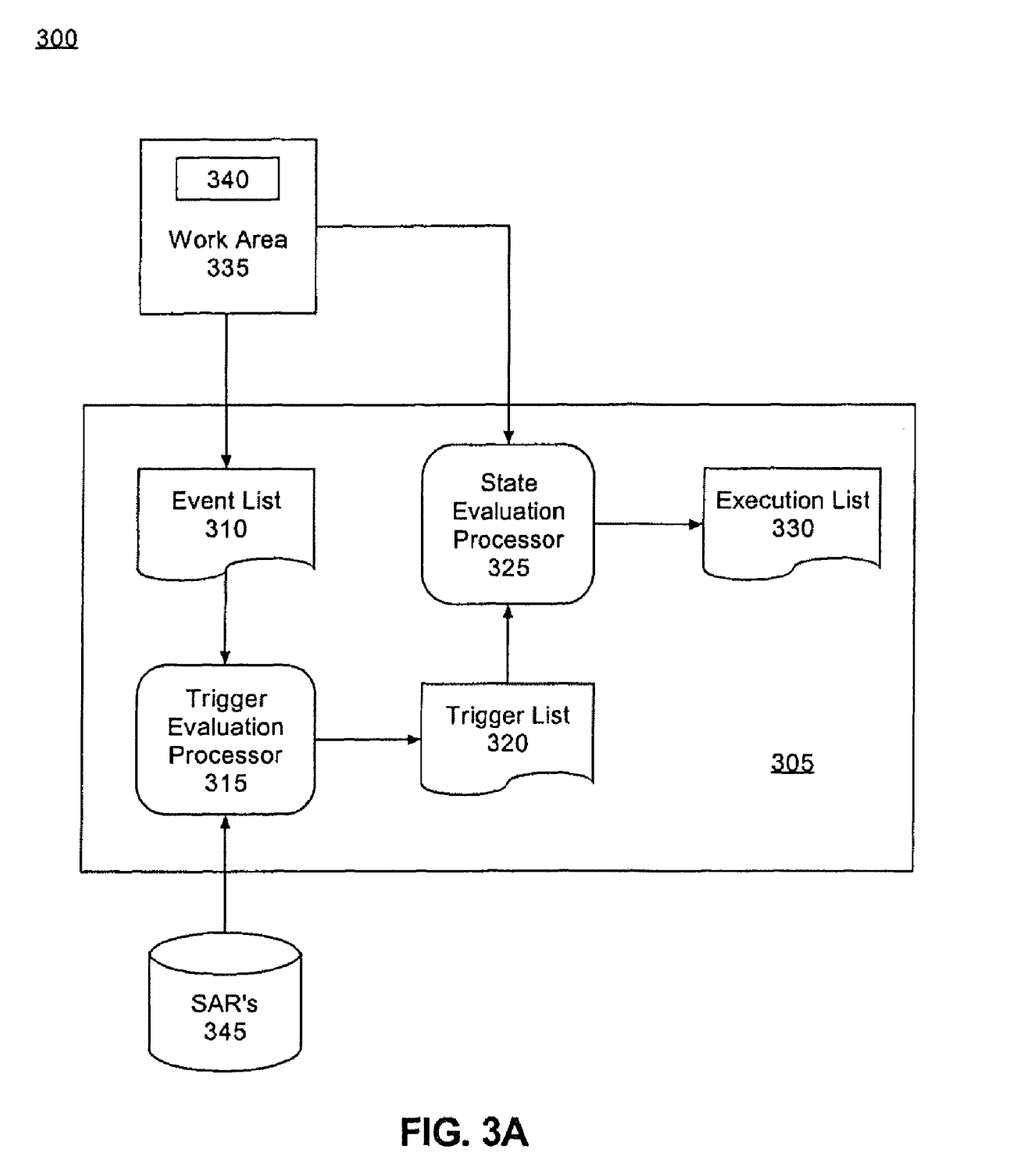
FIG. 3A is a schematic diagram illustrating yet another embodiment of a system for invoking pattern-based Web services in accordance with the inventive arrangements disclosed herein.

FIG. 3A is a schematic diagram illustrating a system 300 for processing complex requests for Web services in accordance with another embodiment of the present invention. The system 300A can include a scheduler 305, a work area 335, and service activation rules 345. As shown, a pattern object 340 can be placed in the work area 335.

An event list 310 can be sent to the scheduler 305. As noted, the event list 310 can be sent from the work area 335 in cases where one or more pattern objects, such as pattern object 340, are added, removed, or modified within the work area 335. The event list specifies one or more events. Each of the events specifies trigger information for causing one or more watchers and associated Web services to be invoked.

The trigger evaluation processor 315 compares the received events in the event list 310 with the service activation rules 345. More particularly, the trigger information of the received events is compared with the trigger condition specified in each of the service activation rules 345. The trigger evaluation processor 315 can identify those service activation rules having a trigger condition matching the trigger information specified by the event list 310. Accordingly, the trigger evaluation processor 315 adds each matching service activation rule to a trigger list 320.

The state evaluation processor 325 analyzes the service activation rules specified in the trigger list 320 with respect to the pattern object 340. Specifically, the state evaluation processor 325 compares the state condition of each service activation rule in the trigger list 320 with the state information of the pattern object 340. The service activation rules from the trigger list 320 that have state conditions matching the state information of the pattern object 340 are added to an execution list 330. The service activation rules of the execution list 330 are then executed to cause each watcher corresponding to the service activation rules of the execution list 330 to be executed. Notably, the scheduler 305 can include logic which analyzes the service activation rules in the execution list 330. The scheduler 305 can determine which watchers to invoke based upon the service activation rules in the execution list 330.

Figure 3B:
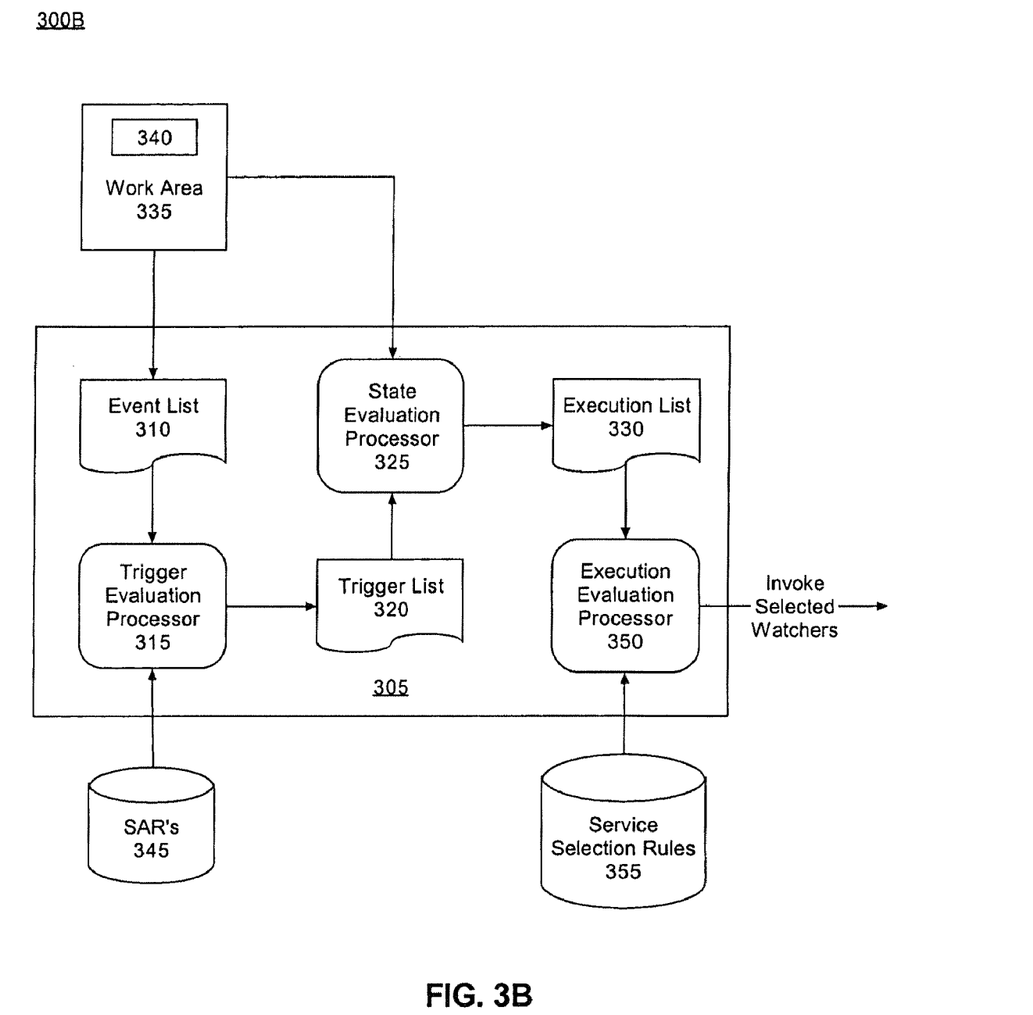
FIG. 3B is a schematic diagram illustrating another embodiment of a system for invoking pattern-based Web services in accordance with the inventive arrangements disclosed herein.

FIG. 3B is a schematic diagram illustrating another embodiment of a system 300B for invoking pattern-based Web services in accordance with the inventive arrangements disclosed herein. The system 300B of FIG. 3B is substantially similar to that of FIG. 3A in terms of the components used and functionality. System 300B differs in that an execution evaluation processor 350 and a service selection rules data store 355 have been added.

The execution evaluation processor 350 can be programmed to resolve conflicts between competing service activation rules in the execution list 330. Although each service activation rule can pertain to a particular Web service, according to one embodiment of the present invention, multiple Web services that perform the same or similar function can be registered with the core server. For example, more than one Web service for dialing a telephone number can be registered with the core server. Each similar Web service can have a service activation rule that requires consideration of that Web service for performing the task. In other words, each Web service that can dial a telephone number or perform a like function can be associated with a different service activation rule. It is possible, however, for each of the service activation rules for the similar or identical functioning Web services to specify the same trigger condition and state condition. A similar situation can arise where more than one Web service performs the same function albeit with differing levels of quality of service.

As a result, each of the service activation rules corresponding to the Web services of like or identical functionality can be selected by the trigger evaluation processor 315 for inclusion within the trigger list 320, as each may specify a same trigger condition. Similarly, each of the service activation rules for the Web services having like or identical functionality also can be selected by the state evaluation processor 325 for inclusion in the execution list 330, as each specifies a same state condition. In consequence, the execution list 330 can include multiple service activation rules, each corresponding to a Web service that performs a same or similar function.

The execution evaluation processor 350 can analyze the service activation rules in the execution list 330 and select one of the competitive service activation rules, and therefore one of the competitive Web services for execution. Taking the previous example, in the case where multiple dialing Web services have corresponding service activation rules in the execution list 330, the execution evaluation processor 350 can choose the service activation rule for a particular dialer Web service.

The execution evaluation processor 350 can choose particular service activation rules based upon criteria specified in the service selection rules 355. More particularly, the service selection rules 355 can include one or more rules, whether developed through heuristics or set by user preferences, that dictate which one of several similar or identical functioning Web services should be executed.

For example, the rules can specify a preferred Web service provider for dialing a telephone number. The rules can specify which of several Web service providers should be selected based upon the time of the day, the date, or based upon fees charged by the Web services. This enables the user to select a Web service based upon user preference, time, cost, etc. Any data item specified in the service activation rules, or within an external data store (not shown) that can be accessed by the execution evaluation processor 350, can be compared with the service selection rules. The service activation rules matching the service selection rules can be identified, thereby causing the competing Web services that match the identified service activation rules to be executed. Thus, any non-competing service activation rules along with any identified ones of the competing service activation rules in the execution list can be selected causing each associated Web service to execute.

Figure 4:
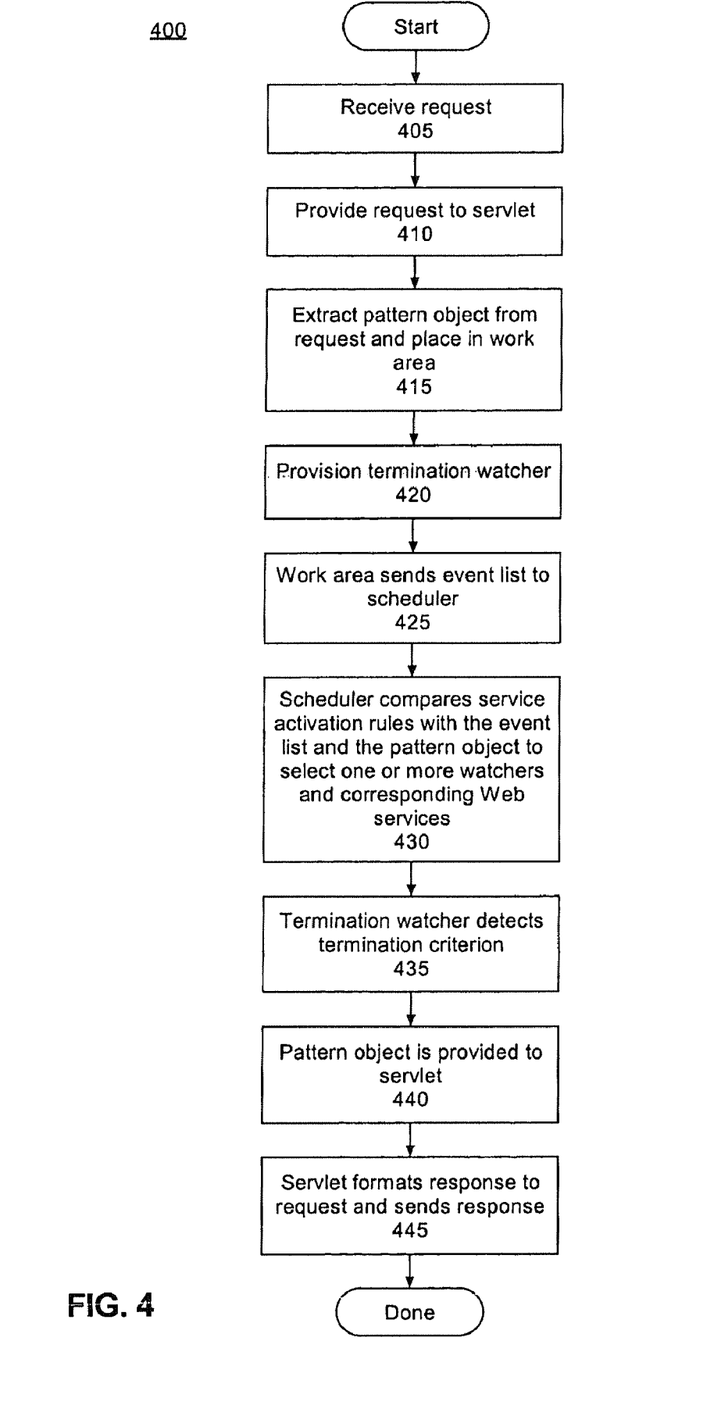
FIG. 4 is a flow chart illustrating a method of processing complex requests for Web services in accordance with one embodiment of the present invention.

FIG. 4 is a flow chart illustrating a method 400 for processing complex requests for Web services in accordance with another aspect of the present invention. The method can begin in a state where one or more Web services have been registered with the core server. Accordingly, each Web service can be associated with a watcher. That is, a watcher can be instantiated for each Web service registered with the core server. Each Web service further can provision one or more rules within each associated watcher as specified within each Web service. The watchers, in turn, register with the core server by adding the provisioned rules to the service activation rule data store.

Thus, in step 405, a request such as a SOAP request can be received by the HTTP server disposed within the core server. The HTTP server can select an available one of the servlets and forward the request to the selected servlet in step 410. In step 415, the servlet can receive and process the request. More particularly, the servlet can extract a pattern object from the received request and store the pattern object in the work area. As noted, the pattern object can specify one or more services to be invoked, thereby enabling the initiation of more than one Web service via a single request.

In one embodiment of the present invention, in step 420, the servlet can provision one or more rules within the termination watcher. It should be appreciated that the request or the pattern object itself can specify the termination rules to be provisioned and applied with respect to the termination watcher. Accordingly, if so configured, each request can provision one or more different termination rules which specify different conditions for detecting the completion of execution of the combination of Web services specified by the pattern object as well as different faults which also can vary with the combination of Web service specified by the pattern object.

Still, as noted, in another embodiment, the termination watcher need not monitor the work area to detect a matching pattern object. Rather, the termination watcher can be invoked by the scheduler when appropriate trigger information from events and state information specified by the pattern object match a service activation rule that invokes the termination watcher.

In step 425, the work area can send an event list to the scheduler. In step 430, the scheduler compares the service activation rules with the event list as well as the pattern object itself to execute one or more watchers and corresponding Web services. The Web services can operate sequentially, concurrently, or both sequentially and concurrently as invoked by the watchers and the scheduler. The watchers also can modify the pattern object according to the Web service associated with each watcher.

If a watcher modifies the pattern object, the work area can send an event list to the scheduler with events that specify the changes that were made. Accordingly, the scheduling process can be restarted to again compare the received events and the modified pattern object with the service activation rules. The scheduler can cause one or more watchers to execute as dictated by the comparison. It should be appreciated that as each watcher can modify the pattern object, a chain of Web services can be invoked to operate concurrently, serially, or both concurrently and serially as the pattern object continues to be modified by watchers.

In step 435, the termination watcher can detect a termination criterion. More particularly, the termination watcher can determine that the pattern object matches a rule for termination or determine that a fault has occurred. As noted, however, in another embodiment of the present invention, the termination watcher can be executed by the scheduler in the case where events received by the scheduler and the pattern object match a service activation rule for the termination watcher. In any case, the termination watcher can remove the pattern object from the work area, whether the pattern object has been modified or is in the same condition as when initially placed in the work area. In step 440, the termination watcher can provide the pattern object to the same servlet that extracted the pattern object. As noted, the termination watcher can inform the servlet of the status of the execution of the Web services by indicating that the Web services have executed successfully or that a fault occurred. This information can be included within a message to the servlet or can be included within the pattern object itself.

In step 445, the servlet can build a response to be sent to the requestor. The response can include the pattern object, whether in its original or modified form. The response also can specify whether the Web services executed successfully or a fault occurred, for example whether a time out or another execution error occurred. This information can be included within the response by either including the information within some portion of the response itself or including the information within the pattern object as previously discussed.

Figure 5:
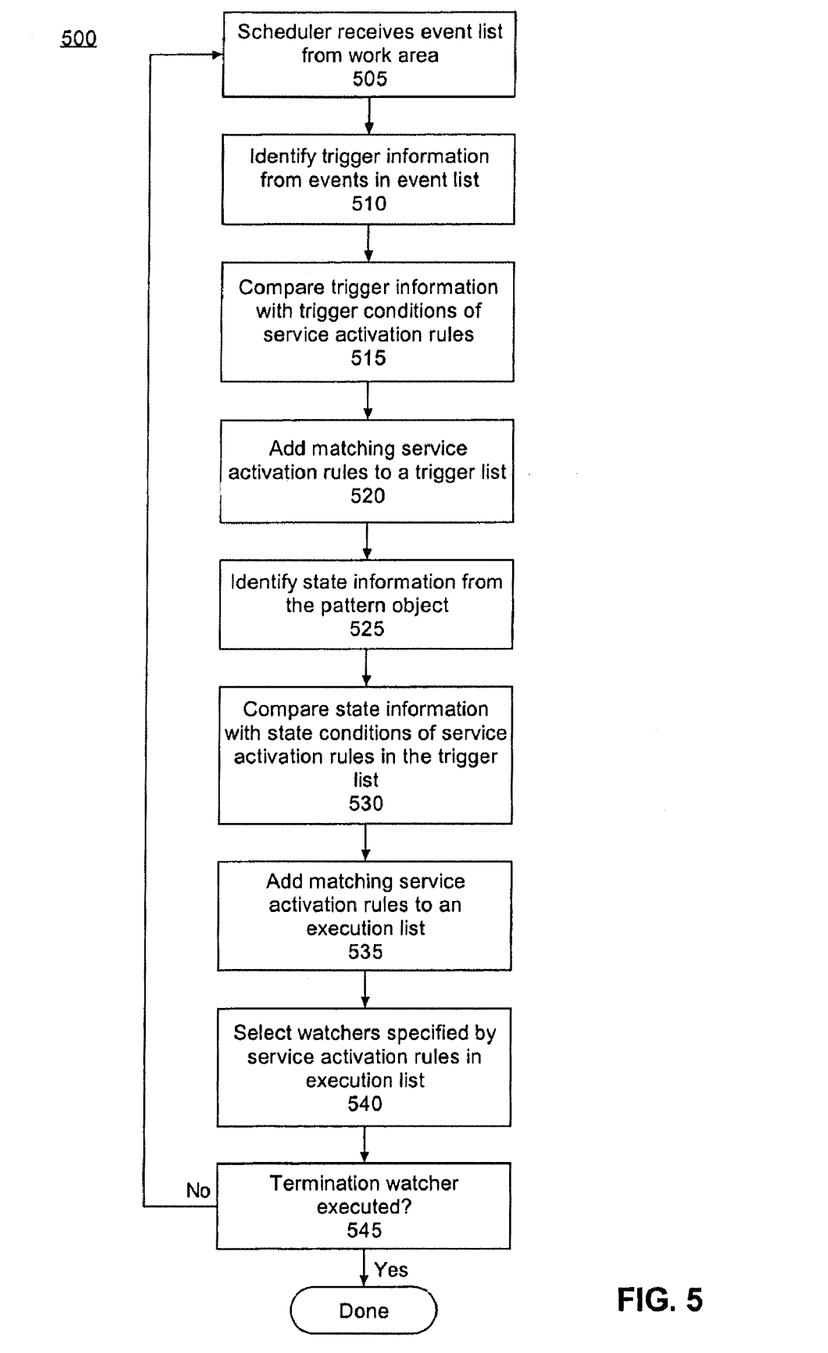
FIG. 5 is a flow chart illustrating a method of processing complex request for Web services in accordance with another embodiment of the present invention.

FIG. 5 is a flow chart illustrating a method 500 of processing complex requests for Web services in accordance with another embodiment of the present invention. The method can begin in a state where a pattern object either has been added to the work area by a servlet or has been modified in the work area by one or more watchers. Accordingly, the method can begin in step 505 where the scheduler receives an event list of one or more events from the work area. For example, if a new pattern of type "X" is added to the work area, then an event in the event list can specify "ADDED PATTERN TYPE X".

In step 510, the scheduler identifies the trigger information from the received event list. Continuing with the previous example, the trigger information can be "PATTERN TYPE X", indicating the type of pattern now in existence in the work area. In step 515, the scheduler can compare the pattern information of the events in the event list with the trigger conditions specified by the service activation rules. In step 520, any service activation rules that match the trigger information of the received events can be added to a trigger list.

In step 525, the scheduler can identify state information from the pattern object in the work area. It should be appreciated that the work area can include one or more pattern objects. Accordingly, the event list received can pertain to or identify a particular pattern object within the work area. Alternatively, an event list can include events pertaining to more than one pattern object, where each event indicates the particular pattern object to which it relates. In any case, the scheduler can identify the state information from the appropriate pattern object, also referred to as the state of the work area. For example, the state information of the pattern object can be "=X.status READY".

In step 530, the scheduler compares the state information of the pattern object with the state conditions of only those status activation rules that have been placed in the trigger list, thereby eliminating the need to compare the state information with the state conditions of each status activation rule in the system. Use of the trigger list further reduces unnecessary system processing overhead. In step 535, any service activation rules from the trigger list having state conditions that match the state information of the pattern object can be added to an execution list. Thus, for example, any status activation rule in the trigger list having a state condition indicating a ready state is added to the execution list.

In step 540, the watchers specified by the service activation rules in the execution list are selected for execution. This causes each watcher to invoke the Web service to which it has been associated. In step 545, if a termination watcher has been executed, the method can end. If not, the method can loop back to step 505 to continue processing additional events until such time that the requested Web services have finished execution or a fault is detected.

Figure 6:
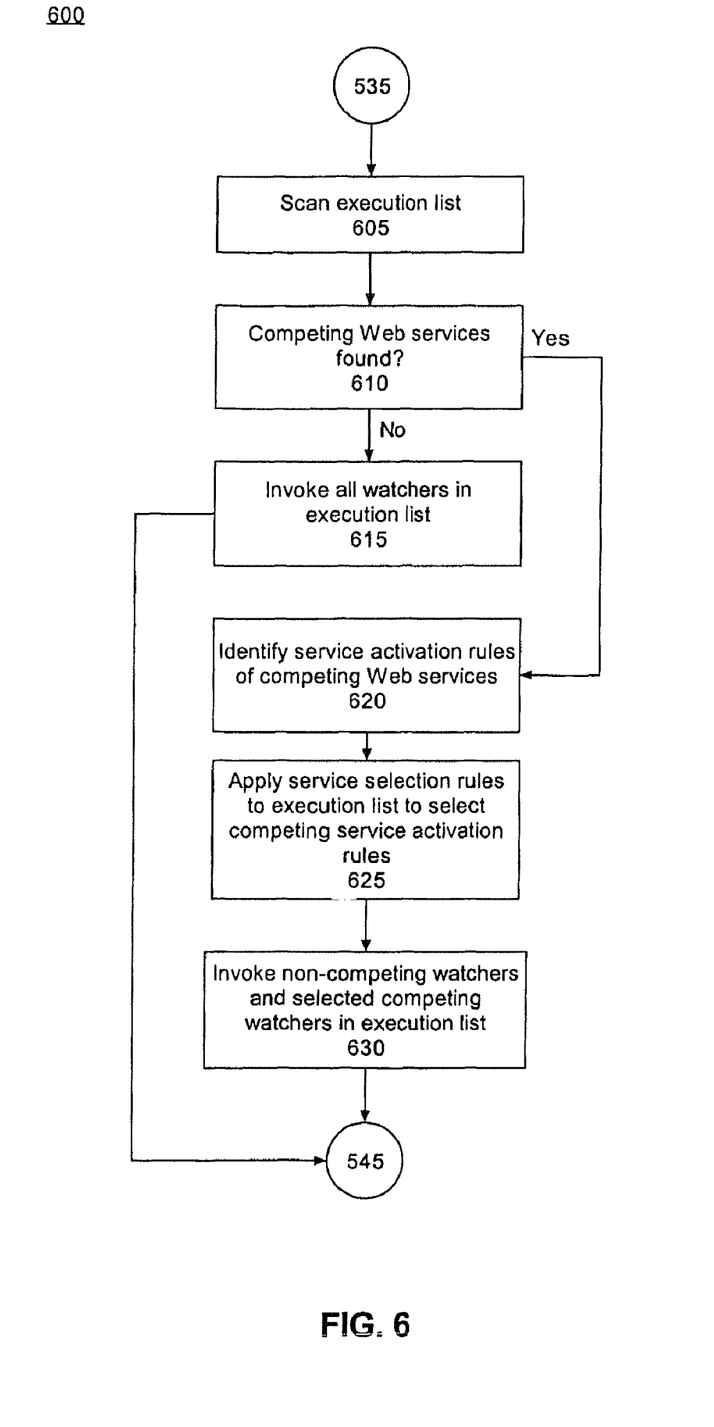
FIG. 6 is a flow chart illustrating a method of selecting one or more service activation rules for implementing a Web service in accordance with the inventive arrangements disclosed herein.

FIG. 6 is a flow chart illustrating a method 600 of selecting one or more service activation rules to implement a Web service in accordance with the inventive arrangements disclosed herein. For example, the method 600 can be used to implement step 540 of FIG. 5. Accordingly, the method 600 can begin in a state where service activation rules have been added to the execution list. Further, two or more of the service activation rules can correspond to like or same functions provided by different Web service providers or Web service provider(s) offering variable qualities of service.

The method 600 can begin in step 605 where the execution evaluation processor can scan the execution list to determine whether any service activation rules for competing Web services exist. That is, the execution evaluation processor can determine whether more than one service activation rule exists in the execution list that correspond to like or identical functioning Web services. In step 610, a determination can be made as to whether any such service activation rules exist. If so, the method can proceed to step 620. If not, the method can continue to step 615.

In step 615, in the case where service activation rules for like or identical functioning Web services are not found within the execution list, all of the watchers specified by the service activation rules in the execution list can be invoked. After step 615, the method can proceed to step 545 and continue as necessary. In step 620, in the case where service activation rules corresponding to like or identical functioning Web services are found within the execution list, each such service activation rule can be identified.

In step 625, the service selection rules can be applied to the execution list by the execution evaluation processor. Using the service selection rules, the execution evaluation processor can determine which of the similar or like Web services are to be invoked. Accordingly, the service activation rules for those Web services, as specified by the service selection rules, can be selected. Thus, in step 630, the watchers corresponding to the service activation rules that were selected in step 625 from the competing service activation rules can be invoked, as well as any other watchers corresponding to other service activation rules in the execution list that are not competitive with one another. The method can proceed to step 545 to continue processing as necessary.

The present invention provides a solution for implementing a plurality of Web services responsive to a single complex request. By incorporating a scheduler that uses both trigger and state information, Web services can be executed more efficiently. Rather than evaluate the trigger condition and state condition of each service activation rule, a trigger list of service activation rules, that is a subset of the entire set of service activation rules having particular trigger conditions, is determined. The trigger list is then searched for service activation rules having matching state conditions. The use of the trigger list enables processing overhead to be reduced as each service activation rule in the system need not be evaluated for both trigger and state conditions.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A system for scheduling pattern-based Web services comprising:
    a plurality of service activation rules, each service activation rule specifying a trigger condition and a state condition for causing a watcher to invoke a particular Web service;
    a server configured to receive a request for more than one Web services;
    at least one servlet configured to extract a pattern object from the request and to format a response to the request;
    a common memory as a work area that temporarily stores the pattern object while the Web services specified by the pattern object execute, wherein said work area dynamically generates events when content of said work area is changed;
    a plurality of watchers, each watcher corresponding to a particular Web service;
    a scheduler configured to receive events from the work area, compare said service activation rules with trigger information of the events, identify service activation rules having trigger conditions and state conditions that match the received event and corresponding pattern object, and select at least one of said service activation rules causing an invocation of at least one of said watchers and corresponding Web services; and
    a termination watcher configured to be provisioned with one or more termination rules and to remove the pattern object from the work area if it is detected that the pattern object conforms one or more of the termination rules.

2. The system of claim 1, wherein said plurality of watchers are further configured to modify the pattern object according to instructions provided from an associated one of the Web services.

3. The system of claim 1, wherein said execution evaluation processor invokes at least one of said watchers according to selected service activation rules.

4. The system of claim 1, wherein the scheduler comprising:
    a trigger evaluation processor configured to compare the trigger conditions of the service activation rules with trigger information from at least one event, wherein said trigger evaluation processor adds service activation rules that match the at least one event to a trigger list; and
    a state evaluation processor configured to compare the state conditions of service activation rules in the trigger list with state information of the pattern object, wherein said state evaluation processor adds service activation rules that match the state information of the pattern object to an execution list.

5. The system of claim 4, further comprising an execution evaluation processor configured to select service activation rules associated with competitive Web services according to service selection rules, wherein the selection rules comprises a heuristic evaluation of the competitive Web services.

6. The system of claim 5, wherein said execution evaluation processor invokes at least one of said watchers according to selected service activation rules.

7. A computer-readable storage, having stored thereon a computer program having a plurality of code sections executable by a computer for causing the computer to perform the steps of:
receiving a request for a plurality of Web services;
extracting a pattern object from the request and placing the extracted pattern object in a work area, the pattern object specifying a plurality of Web services to be invoked;
provisioning one or more termination rules within a termination watcher, wherein the termination watcher removes the pattern object from the work area if it is detected that the pattern object conforms to one or more of the termination rules;
providing a plurality of service activation rules accessible by a scheduler, each service activation rule specifying a trigger condition and a state condition for causing a watcher and a corresponding Web service to be activated;
receiving in the scheduler at least one event generated dynamically and indicating a change in the work area, wherein each event specifies trigger information;
comparing the service activation rules with the trigger information of the at least one event;
identifying service activation rules having trigger conditions and state conditions that match the received event and corresponding pattern object;
causing watchers specified by the identified service activation rules to execute and thus invoke corresponding Web services; and
running the Web services until a termination criterion is detected by the termination watcher.

8. The computer-readable storage of claim 7, wherein each event indicating a change in the work area is associated with the pattern object.

9. The computer-readable storage of claim 7, further causing the machine to perform the steps of:
at least one of the watchers modifying the pattern object in the work area; and
the work area sending at least one event indicating a state change, wherein each event specifies a trigger condition.

10. The computer-readable storage of claim 9, wherein the at least one of the watchers modifies the pattern object in the work area according to instructions from an associated one of the Web services.

11. The computer-readable storage of claim 7, wherein the corresponding pattern object specifies at least two Web services to be performed.

12. The computer-readable storage of claim 11, wherein the at least two Web services operate concurrently with one another.

13. The computer-readable storage of claim 11, wherein the at least two Web services operate sequentially.

14. The computer-readable storage of claim 7, wherein at least one of the watchers modifies the pattern object according to instructions from an associated one of the Web services, 15. The computer-readable storage of claim 7, further causing the machine to perform the steps of:
receiving an event list of one or more events from the work area;
identifying trigger information from events in the event list;
comparing the trigger information with trigger conditions specified by service activation rules;
adding matching service activation rules to a trigger list;
identifying state information from the pattern object in the work area;
comparing the state information of the pattern object with state conditions of the service activation rules that have been added to the trigger list;
adding matching service activation rules to an execution list; and
selecting watchers specified by service activation rules in the execution list for execution, causing each watcher to invoke a corresponding Web service.

16. The computer-readable storage of claim 7, further causing the machine to perform the steps of:
scanning the execution list to determine whether any service activation rules for competing Web services exist;
if no service activation rules for competing Web services exist, invoking all watchers in the execution list;
if service activation rules for competing Web services exist, performing the following steps:
identifying service activation rules in the execution list corresponding to competing Web services;
selecting certain service activation rules from the identified service activation rules corresponding to competing Web services using at least one service selection rule, wherein the at least one selection rule comprises a heuristic evaluation of the competing Web services; and
invoking watchers specified by the selected service activation rules.

* * * * *